United States Patent [19]

Keller et al.

[11] Patent Number: 5,256,245

[45] Date of Patent: Oct. 26, 1993

[54] USE OF A CLEAN UP STEP TO FORM MORE VERTICAL PROFILES OF POLYCRYSTALLINE SILICON SIDEWALLS DURING THE MANUFACTURE OF A SEMICONDUCTOR DEVICE

[75] Inventors: David J. Keller; Guy T. Blalock, both of Boise, Id.

[73] Assignee: Micron Semiconductor, Inc., Boise, Id.

[21] Appl. No.: 928,922

[22] Filed: Aug. 11, 1992

[51] Int. Cl.$^5$ .................. H01L 21/306; B44C 1/22
[52] U.S. Cl. .................. 156/643; 156/657; 437/226
[58] Field of Search .......... 156/643, 657; 437/226

[56] References Cited

U.S. PATENT DOCUMENTS

| | | | |
|---|---|---|---|
| 5,078,833 | 1/1992 | Kadomura | 156/657 |
| 5,094,712 | 3/1992 | Becker et al. | 156/657 |
| 5,116,460 | 5/1992 | Bukhman | 156/657 |

*Primary Examiner*—Carl F. Dees
*Attorney, Agent, or Firm*—Stanley N. Protigal

[57] ABSTRACT

Disclosed is a process step performed during a wafer etch which allows for the formation of more vertical sidewalls. During a conventional etch step of a material such as oxide, oxygen is released into the etch chamber, which is known to adversely affect the vertical profile of the sidewalls. The oxygen is known to combine with silicon and HBr, which are present as gasses within the etch chamber during the subsequent poly etch, to deposit on the poly sidewalls. For this reason subsequent etches are conventionally performed in a separate etch chamber.

The disclosed step introduces an oxygen-scavenging gas into the etch chamber prior to the subsequent etch of the polycrystalline silicon. The oxygen-scavenging gas combines with the liberated oxygen with the application of plasma energy to produce an inert volatile gas which can be pumped from the etch chamber and therefore not adversely affect subsequent etches. Claimed oxygen-scavenging gasses include $C_2F_6$, $CF_4$, $CHF_3$, and $BCl_3$.

19 Claims, 1 Drawing Sheet

5,256,245

USE OF A CLEAN UP STEP TO FORM MORE VERTICAL PROFILES OF POLYCRYSTALLINE SILICON SIDEWALLS DURING THE MANUFACTURE OF A SEMICONDUCTOR DEVICE

FIELD OF THE INVENTION

This invention relates to the field of semiconductor device manufacture. More specifically, a one chamber in situ etch step is described which allows for the formation of more vertical polycrystalline silicon sidewalls than previous one chamber poly etches, especially in devices having sub-half micron feature sizes.

BACKGROUND OF THE INVENTION

An electronic circuit is chemically and physically integrated into a substrate such as a silicon wafer by patterning regions below the surface of the substrate, and by patterning layers of various materials over the surface of the substrate. These regions and layers can be conductive for conductor and resistor fabrication, or insulative for insulator and capacitor fabrication. They can also be of differing conductivity types, which is essential for transistor and diode fabrication. Degrees of resistance, capacitance, and conductivity are controllable, as are the physical dimensions and locations of the patterned regions and layers, making circuit integration possible. Fabrication can be quite complex and time consuming, and therefore expensive. It is thus a continuing effort of those in the semiconductor fabrication business to reduce fabrication times and costs of such devices in order to increase profits. Any simplified processing step or combination of processes at a single step becomes a competitive advantage.

A situation where a process simplification is desirable is in the anisotropic etch of a layer of oxide on a layer of silicide on a layer of polycrystalline silicon (poly). In this disclosure, "oxide" denotes an oxide of silicon and "silicide" refers to tungsten silicide. 37 Polycide" denotes a silicide-over-poly combination. Oxide is an insulator with dielectric properties. Poly is resistive in nature, but is made less resistive when doped with an element having less or more than four valence electrons (depending on whether the poly defines a P-channel or N-channel device), or when layered with conductive silicide. "Anisotropic etch" refers to a directionally preferential etch in which the etch rate in one direction, usually vertically, greatly exceeds the etch rate in other directions. This is typically accomplished by plasma etching in which the plasma energy erodes substrate material in a direction established by the ion flow. Advantages of anisotropic etching include reduced sidewall erosion, reduced undercutting, and improved line width control. This contrasts with isotropic etching, wherein etching is achieved at a more uniform rate across all exposed surfaces.

An oxide/silicide/poly sandwich structure presents a difficult etching task, particularly with an additional mask layer of photoresist (resist), which must be the case if patterning is desired. The difficulty is partly due to the distinct differences in the way oxide and polycide are etched, particularly with resist still present on top of the structure.

Both oxide and polycide can be etched using a parallel plate plasma reactor. However, an oxide is typically etched in fluorine deficient fluorocarbon based plasmas, whereas silicide and poly can be etched in fluorine or chlorine based discharges. Reactor cathode materials may also differ: for oxide etch, an erodible cathode such as graphite or silicon is often used to provide a source of carbon or silicon for etch selectivity, whereas for polycide etch, an inert cathode is preferred, especially when utilizing chlorine gas ($Cl_2$) for selectivity. If a single-chamber process were attempted using conventional art to etch an oxide/silicide/poly sandwich structure, the erodible cathode required for oxide etch would be destroyed by the chlorine required for polycide etch. Using conventional methods, the two steps are incompatible.

Oxide etch in general is fairly well understood, given a universal need for a vertical profile. This vertical profile is realized primarily by ion induced reaction with the oxide, coupled with normal incidence of the ions onto the oxide surface. The amount and energy of these ions are primarily controlled by the reactor's RF power and gap. Generally, a fluorocarbon-based gas mixture is introduced at a low pressure into the etch chamber. The exact gas composition is chosen, and an erodible cathode is used to scavenge excessive fluorine radicals so that the fluorine-to-carbon ratio is near, but not beyond, the so-called polymerization point. Under these conditions, when a plasma is ignited, the fluorocarbons are dissociated and release fluorine radicals and $CF_x$ species. Although fluorine radicals etch oxide, they do so very slowly: the primary etchant for oxide is considered to be the $CF_x$ species. Some of these species diffuse to the oxide surface where, with the assistance of ion bombardment, they react with the oxide and release volatile byproducts $SiF_4$, CO, and $CO_2$. In addition, some of the $CF_x$ species react with each other to form fluorocarbon polymers. Polymer that forms on horizontal surfaces is removed by vertical ion bombardment. Polymer that forms on vertical sidewalls during this oxide etch is not significantly degraded by the bombardment, and actually serves a useful purpose by protecting the oxide sidewalls from attack by the etchant species. This sidewall protection enables the achievement of vertical profiles, adjustable by varying the fluorine-to-carbon ratio. As the cathode is eroded, the quantity of available fluorine radicals is reduced. Therefore, a polymer-producing gas such as $CHF_3$ is balanced against a fluorine producing gas such as $CF_4$ to provide proper selectivity, with assistance to sidewall protection.

Two methods are conventionally used to etch an oxide/silicide/poly sandwich structure. Both methods use separate reactors: one for the oxide etch, and one for the polycide etch.

In the first method, the oxide etch reactor uses fluorocarbon-based chemistry, high RF power, and an erodible cathode. The sidewalls remain straight and the etch stops soon after entering the silicide. After oxide etch, the wafer is removed from the chamber and the resist is stripped (piranha etch). The silicide/poly sandwich is then etched in a poly etch reactor, using an inert cathode. Both etches are anisotropic.

The second method uses the same principles as the first, except that there are two reactors in one machine. The two reactors are configured as separate oxide and polycide reactors having a common vacuum transfer area, so that a wafer can be transferred in a vacuum from the oxide reactor to the polycide reactor, thus minimizing additional handling. The resist is generally not removed prior to polycide etch in this method. This is sometimes referred to as "in situ" since the wafers never leave the vacuum of one machine. However, they are not truly in situ in the sense that two etch chambers are used. A one chamber in situ etch process has recently been developed by Micron Technology, Inc. and is described in U.S. Pat. No. 5,094,712, which is incorporated herein by reference.

As the feature size of semiconductor devices such as dynamic random access memories (DRAMs) continues to decrease it becomes increasingly important to minimize irregularities during the formation of the device. For example, cell gate widths approaching 0.5 microns require that vertical sidewalls be strictly maintained to provide adequate area to store a charge. Advances in process technology which decrease surface irregularities are desirable.

SUMMARY OF THE INVENTION

An object of the invention is to provide a one chamber in situ etch step which increases the angle of sidewalls during the formation of a semiconductor device.

This and other advantages of the invention are realized by an inventive step to improve the chemistry in the etch chamber during the one chamber in situ etch process described in U.S. Pat. No. 5,094,712. The step could also be used with other etch processes which are negatively affected by the presence of oxygen which, in the incorporated reference, is released into the etch chamber during both the oxide and silicide etches. This free oxygen embeds itself in the walls of the etch chamber and cannot be removed with a gas purge step. While the amount of oxygen present in an etch chamber during the etch of the oxide-silicide-poly pillar can be minimal, the effect of any remaining oxygen on the formation of the semiconductor device increases with decreasing feature sizes. If the oxygen remains in the etch chamber during a subsequent poly etch, it can combine with the HBr and Si which are present in the plasma of the main poly etch step to form contamination such as from a $Si_xBR_yO_z$ type compound. The contamination can then build up on the poly sidewalls, which changes the etch characteristics of the structure. The etch of the contamination occurs at a different rate than the etch of the pure poly feature, thereby resulting in undesirable sloping sidewalls.

The liberated oxygen is removed with the present invention by the introduction of other atoms or molecules with which the oxygen will combine upon the application of energy provided by a plasma to form a volatile compound that will be pumped from the chamber to allow for the formation of more vertical sidewalls. Specifically, carbon containing materials such as $CF_4$ or $CHF_3$ can be used alone or in combination, as well as nonorganic compounds such as $BCl_3$. These gasses are introduced into the etch chamber and excited with, for example, a plasma with the plasma providing energy to strike the oxygen scavenging chemical reactions.

DETAILED DESCRIPTION OF THE INVENTION

Figure 1:
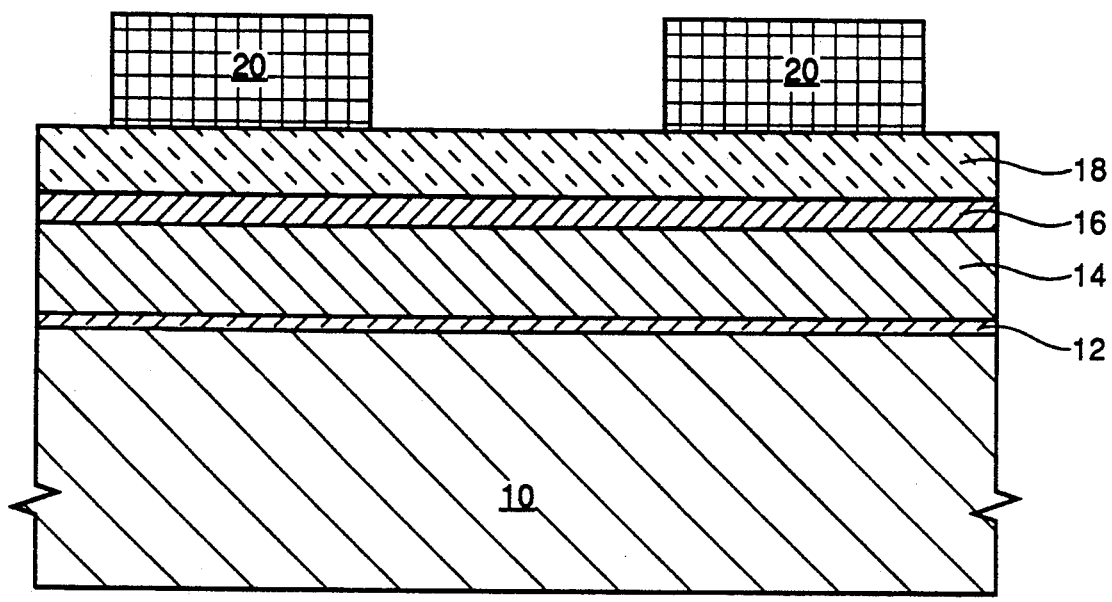
FIG. 1 shows a cross section of a poly-silicide-oxide sandwich formed over a semiconductor substrate having a patterned layer of photoresist formed thereupon.

FIG. 1 shows a typical structure having a substrate covered 10 with layers of gate oxide 12, polycrystalline silicon 14, tungsten silicide 16, and oxide 18, with a patterned layer of photoresist 20 over the oxide layer 18. Fabrication and masking of this structure are completed by methods well known to those skilled in semiconductor design and processing, and hence are not fully disclosed herein. In addition, the inventive step is described in terms of use with the invention of U.S. Pat. No. 5,094,712, although it is also generally useful with any etch process where the presence of oxygen negatively affects the etch of poly sidewalls.

The wafer having the masked structure is transferred into a plasma etch chamber, for example an Applied Materials Corporation (of Santa Clara, CA) RIE (magnetically enhanced reactive ion etching plasma reactor), having a fixed gap, four electrically controlled magnetic coils, and a 13.56 Mhz RF power plasma generator for a process having three etch steps: oxide etch, tungsten etch, and polysilicon etch. In the oxide etch step, oxide 18 not protected by resist 20 is exposed to a plasma of about 3.4 $W/cm^2$ power density with a 100 gauss magnetic field, at a fixed electrode gap, in a 0.200 torr atmosphere of 35 sccm $CF_4$, and 35 sccm $CHF_3$. In this disclosure, "sccm" denotes standard cubic centimeters per minute, and "gap" refers to the distance between plasma electrodes, one of which supports the wafer. The oxide etch step requires about one minute.

Immediately after the oxide etch step, in the same chamber and using the same cathode, the silicide layer 16 is etched in a plasma of about 1.3 $W/cm^2$ at a fixed gap in a 0.020 torr atmosphere of 30 sccm $SF_6$ and 10 sccm $He/O_2$. This etch takes about 25 seconds.

During the etch of the oxide and the silicide, oxygen gas is released into the etch chamber. The oxygen, if not removed from the etch chamber, reacts with the gasses present during subsequent poly etches (Si and HBr) to form a non-volatile compound that will deposit on the sidewall of the poly stack as the poly is being etched. To prevent this from occurring, an oxygen-scavenging gas is released into the etch chamber and excited by a plasma before subsequent poly etch steps. The scavenging gas can comprise $CF_4$, $CHF_3$, $BCl_3$, or other gasses, most of which contain carbon (i.e. carbonaceous gases). A clean up step can comprise a combination of gasses and concentrations, for example 50 sccm $CF_4$ and 10 sccm $CHF_3$. This combination will scavenge $O_2$ in the plasma to form CO and $CO_2$. A flow of any of the gasses listed of about 60 sccm total flow will allow for sufficient removal of the free $O_2$.

Immediately after the oxygen scavenge step, the polysilicon layer 14 is etched with a two-step process in the same chamber and using the same cathode as the silicide etch step described above. The first process is a low selective etch with a plasma of about 1.3 $W/cm^2$ at a fixed gap in a 0.136 torr atmosphere of 10 sccm HBr and 50sccm Cl2. This etch uses an optical emission endpoint system to stop the etch as the poly begins to clear from top of the gate oxide. This etch takes about 60 seconds.

Figure 2:
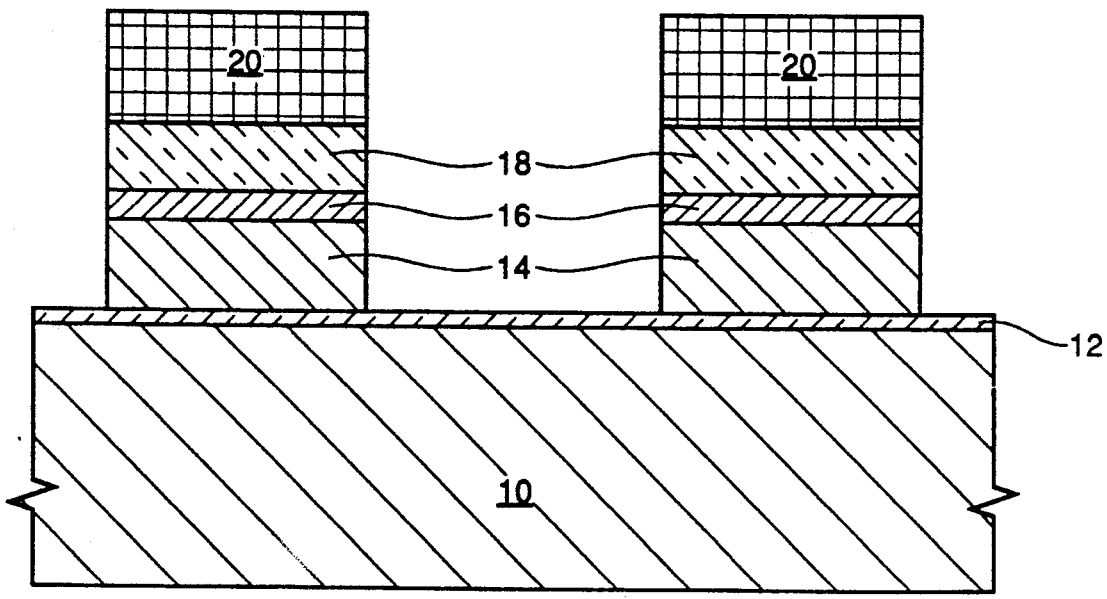
FIG. 2 shows the FIG. 1 structure after an etch of the sandwich.

When the previous poly etch has been stopped with the use of the endpoint system, a highly selective poly etch is done. Typical parameters of this etch include 70 sccm HBr, 30 sccm $H_2$, 6 sccm $HeO_2$, a $\beta$-field of 60 gauss, a pressure of 130 millitorr, and a power of 125 watts (1.0 $W/cm^2$), although these parameters may vary widely to produce sufficient results. This etch takes about 60 seconds. The remaining structure appears as shown in FIG. 2, with a profile at approximately 87°–90°. It is possible to use the $O_2$ in the over etch as the poly gate structure is already defined and a short over etch will not greatly affect this structure.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. It is therefore contemplated that the appended claims will cover any such modifications or embodiments as fall within the true scope of the invention.

What is claimed is:

1. A process for etching a structure in a chamber, said structure having a layer of polycrystalline silicon and a layer of an oxide, said process comprising the steps of:
   a) etching said oxide layer with a plasma etch, thereby liberating oxygen into said chamber;
   b) releasing an oxygen-scavenging gas into said chamber;
   c) releasing an oxygen-scavenging gas to chemically react said oxygen-scavenging gas with said liberated oxygen;
   d) etching said polycrystalline silicon with a plasma etch,
   whereby said chemical reaction substantially removes said liberated oxygen from said chamber and allows for a substantially vertical etch of aid polycrystalline silicon.

2. The process of claim 1, wherein said oxygen-scavenging gas is a carbonaceous gas.

3. The process of claim 2, wherein said oxygen-scavenging gas is present in said chamber at a flow of between about 10 sccm and 75 sccm.

4. The process of claim 2, wherein said oxygen-scavenging gas comprises a compound selected from the group consisting of $C_2F_6$, $CF_4$, and $CHF_3$.

5. The process of claim 1, wherein said oxygen-scavenging gas comprises $BCl_3$.

6. The process of claim 1, wherein said polycrystalline silicon etch comprises the use of chlorine.

7. The process of claim 1 wherein the plasma power density of the etch in step d) is selected to provide a finished structure having a vertical profile at or near 87°–90° from horizontal.

8. A process to anisotropically etch a wafer on which a dielectric overlies a layer of silicide and silicon formed over a substrate in an etch chamber, the process comprising the steps of:
   a) providing a parallel plate plasma etch reactor having a first electrode whereupon said substrate is mounted and a second electrode that is non-erodible by plasma;
   b) providing a first atmosphere within said reactor, said atmosphere comprising $CHF_3$ and $CF_4$;
   c) exposing said dielectric layer to a plasma wherein oxygen is liberated into said chamber;
   d) providing, within said reactor, an atmosphere comprising He, $O_2$ and $SF_6$;
   e) etching said silicide in said reactor by exposing the wafer to a plasma;
   f) releasiing an oxygen-scavenging gas into said etch chamber;
   g) exciting said oxygen-scavenging gas to chemically react said oxygen-scavenging gas with said liberated oxygen;
   h) providing, within said reactor, an atmosphere comprising HBr and $Cl_2$;
   i) etching said silicon in said reactor by exposing the wafer to a plasma.

9. The process of claim 8, wherein said oxygen-scavenging gas is a carbonaceous gas.

10. The process of claim 9, wherein said oxygen-scavenging gas is present in said chamber at a flow of between about 10 sccm and 75 sccm.

11. The process of claim 9, wherein said oxygen scavenging gas comprises a compound selected from the group consisting of $C_2F_6$, $CF_4$, and $CHF_3$.

12. The process of claim 8, wherein said oxygen-scavenging gas comprises $BCl_3$.

13. The process of claim 8, wherein the plasma power density of the etch in step h) is selected to provide a finished structure having a vertical profile at or near 87°–90° from horizontal.

14. A method to anisotropically etch a wafer on which a dielectric overlies a layer of silicide and silicon deposited over a substrate, comprising the steps of:
   a) providing a parallel plate plasma etch reactor having a first electrode whereupon the substrate is mounted and a second electrode that is non-erodible by plasma;
   b) providing a first atmosphere within said reactor, said atmosphere comprising $CHF_3$ and $CF_4$;
   c) exposing said dielectric layer to a plasma thereby liberating oxygen;
   d) etching said silicide and said silicon by etching in a second atmosphere, said second atmosphere comprising He, $O_2$, and $SF_6$;
   e) releasing an oxygen-scavenging gas into said etch chamber;
   f) exciting said oxygen-scavenging gas to chemically react said oxygen-scavenging gas with said liberated oxygen;
   g) etching said silicon in an atmosphere of 10 SCCM HBr and 50 SCCM $Cl_2$.

15. The process of claim 14, wherein said oxygen-scavenging gas is a carbonaceous gas.

16. The process of claim 15, wherein said oxygen-scavenging gas is present in said chamber at a flow of between about 10 sccm and 75 sccm.

17. The process of claim 15, wherein said oxygen-scavenging gas comprises a compound selected from the group consisting of $C_2F_6$, $CF_4$, and $CHF_3$.

18. The process of claim 14, wherein said oxygen-scavenging gas comprises $BCl_3$.

19. The process of claim 15, wherein the plasma power density of the etch in the second atmosphere is selected to provide a finished structure having a vertical profile at or near 87°–90° from horizontal.

* * * * *

UNITED STATES PATENT AND TRADEMARK OFFICE
CERTIFICATE OF CORRECTION

PATENT NO. : 5,256,245
DATED : October 26, 1993
INVENTOR(S) : Keller et al.

It is certified that error appears in the above-indentified patent and that said Letters Patent is hereby corrected as shown below:

Column 1, line 40, kindly delete " 37 Polycide" " and insert -- "Polycide" --.

Column 5, line 25, kindly delete "releasing an" and insert -- exciting said --.

Column 5, line 32, kindly delete "aid" and insert -- said --.

Signed and Sealed this

Nineteenth Day of April, 1994

Attest:

BRUCE LEHMAN

Attesting Officer

Commissioner of Patents and Trademarks